United States Patent
Mink et al.

(10) Patent No.: US 10,636,588 B2
(45) Date of Patent: Apr. 28, 2020

(54) SHIFT OPERATING ELEMENT

(71) Applicant: Marquardt GmbH, Rietheim-Weilheim (DE)

(72) Inventors: Achim Mink, Tuttlingen (DE); Roland Neitzel, Mühlheim (DE)

(73) Assignee: Marquardt GmbH, Rietheim-Weilheim (DE)

( * ) Notice: Subject to any disclaimer, the term of this patent is extended or adjusted under 35 U.S.C. 154(b) by 0 days.

(21) Appl. No.: 16/246,755

(22) Filed: Jan. 14, 2019

(65) Prior Publication Data
US 2019/0198263 A1 Jun. 27, 2019

Related U.S. Application Data

(63) Continuation of application No. PCT/EP2017/067654, filed on Jul. 13, 2017.

(30) Foreign Application Priority Data

Jul. 15, 2016 (DE) ........................ 10 2016 008 498

(51) Int. Cl.
*H01H 3/02* (2006.01)
*G01D 5/241* (2006.01)
(Continued)

(52) U.S. Cl.
CPC ......... *H01H 3/0213* (2013.01); *G01D 5/2417* (2013.01); *H01H 1/06* (2013.01);
(Continued)

(58) Field of Classification Search
CPC ........ H01H 3/0213; H01H 1/06; H01H 13/84; H03K 17/962; H03K 17/975
See application file for complete search history.

(56) References Cited

U.S. PATENT DOCUMENTS 6,373,265 B1 * 4/2002 Morimoto ............ G01D 5/2417
324/661
7,595,712 B2 * 9/2009 Nishino ................. G05G 9/047
200/302.3
(Continued)

FOREIGN PATENT DOCUMENTS

DE 10 2013 021 575 A1 6/2015
EP 2 629 422 A1 8/2013
(Continued)

OTHER PUBLICATIONS

International Search Report and Written Opinion (Application No. PCT/EP2017/067654) dated Oct. 19, 2017.
(Continued)

*Primary Examiner* — Kyung S Lee
(74) *Attorney, Agent, or Firm* — Burr & Brown, PLLC

(57) ABSTRACT

The invention relates to a shift operating element, specifically for a motor vehicle, having an actuation surface which can be moved by the manual application of force by means of an element, wherein the element is specifically the finger of a human hand. The shift operating element comprises a sensor which interacts with the actuation surface such that the sensor, upon the movement of the actuation surface by means of the element, generates a signal. The signal is specifically employed to shift and/or trigger a function, in the manner of a shift signal. A mechanical damping and/or restoring element is provided which interacts with the actuation surface upon the movement thereof. The mechanical damping and/or restoring element is a constituent of the sensor, specifically the mechanical damping and/or restoring element is integrated into the sensor.

11 Claims, 3 Drawing Sheets

(51) Int. Cl.
*H01H 1/06* (2006.01)
*H03K 17/96* (2006.01)
*H03K 17/975* (2006.01)
*H01H 13/84* (2006.01)
*H01H 3/00* (2006.01)

(52) U.S. Cl.
CPC ........... *H01H 13/84* (2013.01); *H03K 17/962* (2013.01); *H03K 17/975* (2013.01); *H01H 2003/008* (2013.01); *H01H 2239/006* (2013.01); *H01H 2239/024* (2013.01); *H03K 2217/9607* (2013.01); *H03K 2217/96062* (2013.01)

(56) References Cited

U.S. PATENT DOCUMENTS

| | | | | |
|---|---|---|---|---|
| 9,082,559 | B2* | 7/2015 | Sierak | G06F 3/02 |
| 2002/0171439 | A1* | 11/2002 | Ono | H01H 13/785 |
| | | | | 324/658 |
| 2006/0290359 | A1* | 12/2006 | Born | H03K 17/955 |
| | | | | 324/658 |
| 2011/0267300 | A1* | 11/2011 | Serban | G06F 3/03547 |
| | | | | 345/174 |
| 2013/0206569 | A1* | 8/2013 | Sierak | G06F 3/02 |
| | | | | 200/600 |

FOREIGN PATENT DOCUMENTS

| | | |
|---|---|---|
| EP | 2 911 300 A1 | 8/2015 |
| GB | 2 077 512 A | 12/1981 |
| WO | 03/063193 A1 | 7/2003 |

OTHER PUBLICATIONS

English translation of International Preliminary Report on Patentability (Chapter I) (Application No. PCT/EP2017/067654) dated Jan. 24, 2019, 7 pages.

* cited by examiner

SHIFT OPERATING ELEMENT

CROSS REFERENCE TO RELATED APPLICATIONS

This application is a continuation of International Application No. PCT/EP2017/067654 filed Jul. 13, 2017, which designated the United States, and claims the benefit under 35 USC § 119(a)-(d) of German Application No. 10 2016 008 498.7 filed Jul. 15, 2016, the entireties of which are incorporated herein by reference.

FIELD OF THE INVENTION

The present invention relates to a shift operating element. More specifically, the shift operating element can be employed for manual actuation in a motor vehicle.

BACKGROUND OF THE INVENTION

A shift operating element of this type comprises an actuation surface, which can be moved by the manual application of force by the user, by means of an element. Specifically, the element can be the finger of a human hand, by means of which the actuation of the shift operating element is executed. The actuation surface interacts with a sensor such that the sensor, upon the movement of the actuation surface by means of the element, generates a signal. The signal is specifically employed to shift and/or trigger a function which is assigned to the shift operating element, in the manner of a shift signal. For the restoration of the actuation surface to an original position, a spring is employed as a restoring element. The sensor and the spring occupy a certain space in the shift operating element, which space is frequently limited, however.

SUMMARY OF THE INVENTION

The object of the present invention is the further development of the shift operating element with respect to the compactness thereof.

In the shift operating element according to the present invention, a damping and/or restoring element is provided, which interacts with the actuation surface upon the movement thereof, wherein the damping and/or restoring element is a constituent of the sensor. Specifically, the damping and/or restoring element is appropriately integrated into the sensor and/or the sensor is integrated into the damping and/or restoring element. In an advantageous manner, the shift operating element delivers high-quality haptics in combination with small dimensions.

In a further configuration, an actuation element can be arranged on the actuation surface, in order to constitute the operative connection to the sensor. The actuation element can act on the damping and/or restoring element in a simple manner. The arrangement can be configured such that the damping and/or restoring element, upon the application of force to the actuation surface, moves in an approximately plane-parallel manner. Upon the movement of the actuation surface, the actuation element can thus interact with the damping and/or restoring element, in order to generate a signal.

For the economization of individual components, the damping and/or restoring element can function as a first electrical sensor electrode for the sensor. A further electrical sensor electrode can be provided for the sensor, such that the two sensor electrodes constitute a capacitive sensor. The variation in the mutual clearance between the two sensor electrodes, associated with the movement of the damping and/or restoring element, can alter the capacitance of the sensor. The variation in capacitance can be evaluated in a simple manner, and employed to generate the signal. A shift operating element configured in this manner, on the grounds of the small number of individual components, is particularly cost-effective, and can be operated in a functionally secure manner.

In the interests of ease of installation, a circuit board can be provided, wherein the damping and/or restoring element can be fitted to and/or arranged upon the circuit board. The damping and/or restoring element can be arranged in electrical contact with the circuit board to constitute the first sensor electrode. Appropriately, the second sensor electrode can be constituted by printed conductors on the circuit board, which can specifically be configured in the form of copper surfaces. The first sensor electrode on the damping and/or restoring element, by the application of force on the actuation surface, can move in an approximately plane-parallel manner to the second sensor electrode on the circuit board.

The damping and/or restoring element can be a mechanical damping and/or restoring element, which is distinguished by both its simplicity and its cost-effectiveness. In a functionally secure manner, the damping and/or restoring element can be configured as an elastic element, specifically in the form of a spring element. In a preferred manner, the spring element, in turn, can be configured as a leaf spring. In a simple manner, the elastic element can incorporate contact surfaces of approximately H-shaped design, for the purposes of electrical contacting with the circuit board. Moreover, the connecting surface of the contact surfaces can comprise elastic spring arms.

On the connecting surface of the contact surfaces, and specifically on the spring arms, two approximately centrally arranged, mutually opposing and approximately rectangular surfaces can be arranged for interaction with the actuation element. Appropriately, these surfaces can constitute the first sensor electrode. Moreover, a nub can be configured on the surface, for interaction with a stud on the actuation element, thereby permitting a sensitive operation of the shift operating element.

The damping and/or restoring element can be comprised of a metal, thereby ensuring a long service life. In the interests of ease of manufacture, the damping and/or restoring element can be manufactured in the form of a stamped and bent part.

For protection against external influences, a housing can be provided for the shift operating element. The actuation surface can constitute a surface of the housing. On the grounds of the configuration of the shift operating element according to the present invention, the actuation surface can constitute a substantially closed surface of the housing. The damping and/or restoring element and/or the circuit board, in turn, can be arranged in the interior of the housing. In place of the configuration thereof as a capacitive sensor, the damping and/or restoring element can also be a constituent of an inductive sensor, a magnetic sensor, a Hall type sensor or similar.

A particularly preferred configuration of the shift operating element according to the present invention will be established in the following.

In state-of-the-art operating elements, configured in the manner of a Human Machine Interface (HMI) in an automobile, a plurality of closed operating surfaces are incorporated. A plurality of functions can be accommodated in these operating surfaces. The selection of functions can be detected by means of a capacitive sensor system, which is arranged behind the operating surface. The release of the function can be executed by means of a force, which is applied to the operating surface. This force generates a reduction in the overall operating surface. The displacement of the operating surface should be as small as possible.

In general, mechanical damping and the detection of displacement are achieved by two separate systems. In many cases, the space available for components is highly limited. There is thus a need for the design of an element which permits the mechanical damping and/or resetting of the operating surface, and can also be employed for the detection of displacement. This element is to be configured such that optimum sensor-based detection and evaluation is possible.

A haptic element having a sensor function is provided, wherein a mechanical damping and/or restoring element simultaneously functions as a sensor. The damping and/or restoring element is mounted and electrically contacted on a circuit board. A separate sensor electrode is constituted on the circuit board by printed conductors in the form of copper surfaces. The damping and/or restoring element, in combination with the sensor electrode, constitutes an electrical capacitance. The clearance between the damping and/or restoring element and the sensor element influences the capacitance. The damping and/or restoring element is depressed by the application of a plane-parallel force to the circuit board, thereby generating a variation in capacitance. This variation in capacitance is electrically evaluated and is employed as a measure for the application of force. The capacitive sensor can also be replaced by an inductive sensor, or by other detectable sensors.

Advantages which are achievable by means of the present invention are specifically provided, in that an economization of components and/or a reduction in the requisite structural space is possible. The damping and/or restoring element can additionally be employed as a displacement sensor. By means of displacement, the force applied can be determined in a simple and reliable manner, and the variation in capacitance can be detected and evaluated, and generated in the form of a signal.

BRIEF DESCRIPTION OF THE DRAWINGS

An exemplary embodiment of the present invention, including various further developments and configurations, is illustrated in the drawings and is described in greater detail hereinafter.

DETAILED DESCRIPTION OF THE INVENTION

Figure 1:
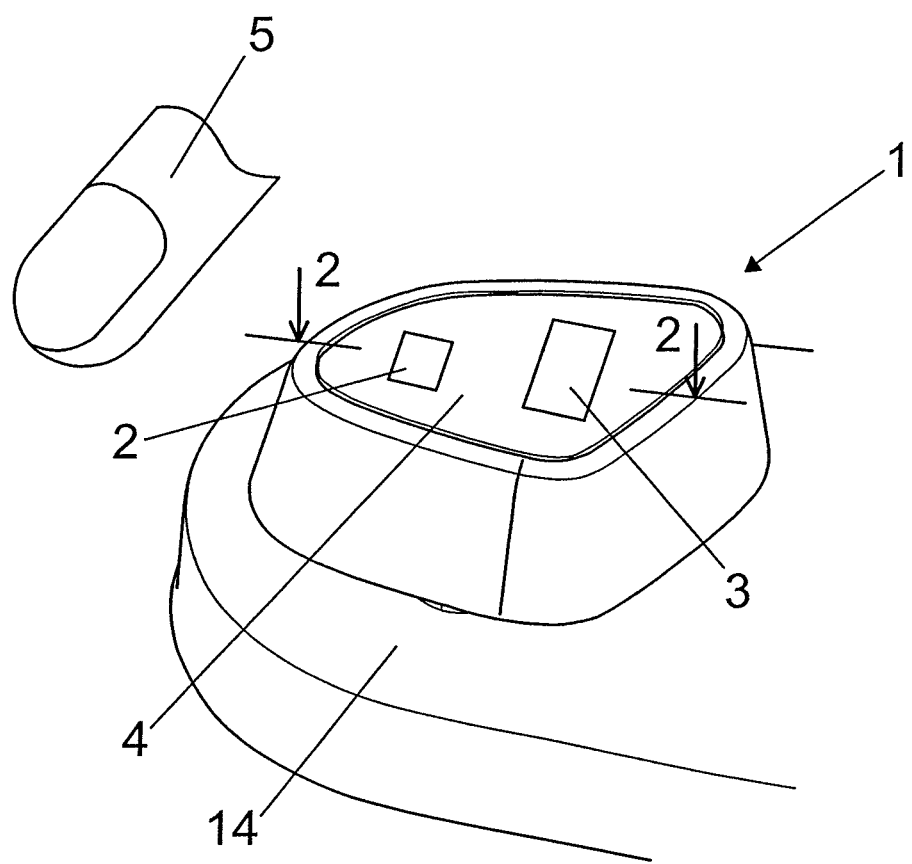
FIG. 1 shows a perspective view of a shift operating element for a motor vehicle.

FIG. 1 shows a shift operating element 1 for a motor vehicle, by means of which a function in the motor vehicle can be triggered and/or actuated. For example, the shift operating element 1 can be employed for the actuation of the fan in the motor vehicle. On the shift operating element 1, a functional symbol 2 is arranged for the representation of the function which can be triggered by means of the shift operating element 1, together with a functional indicator 3 for the representation of the state (on/off) of the respective function, wherein both the functional symbol 2 and the functional indicator 3 can be illuminated.

The shift operating element 1 comprises a housing 14 and an actuation surface 4, wherein the actuation surface 4 is moveably arranged on a surface of the housing 14. The actuation surface 4 thus constitutes a surface of the housing 14, wherein the surface is substantially closed, thereby effectively preventing the penetration of harmful substances into the interior 15 (see FIG. 2) of the housing 14. On the actuation surface 4, by means of an element 5, a force (see FIG. 2) can be manually applied for the actuation of the shift operating element 1. Specifically, the element 5 can be the finger of a human hand. A sensor 6 (see FIG. 2) interacts with the actuation surface 4, such that the sensor 6, upon the movement of the actuation surface 4 by means of the element 5, generates a signal. This signal is then used to shift and/or trigger an associated function in the motor vehicle, in the manner of a shift signal.

Figure 2:
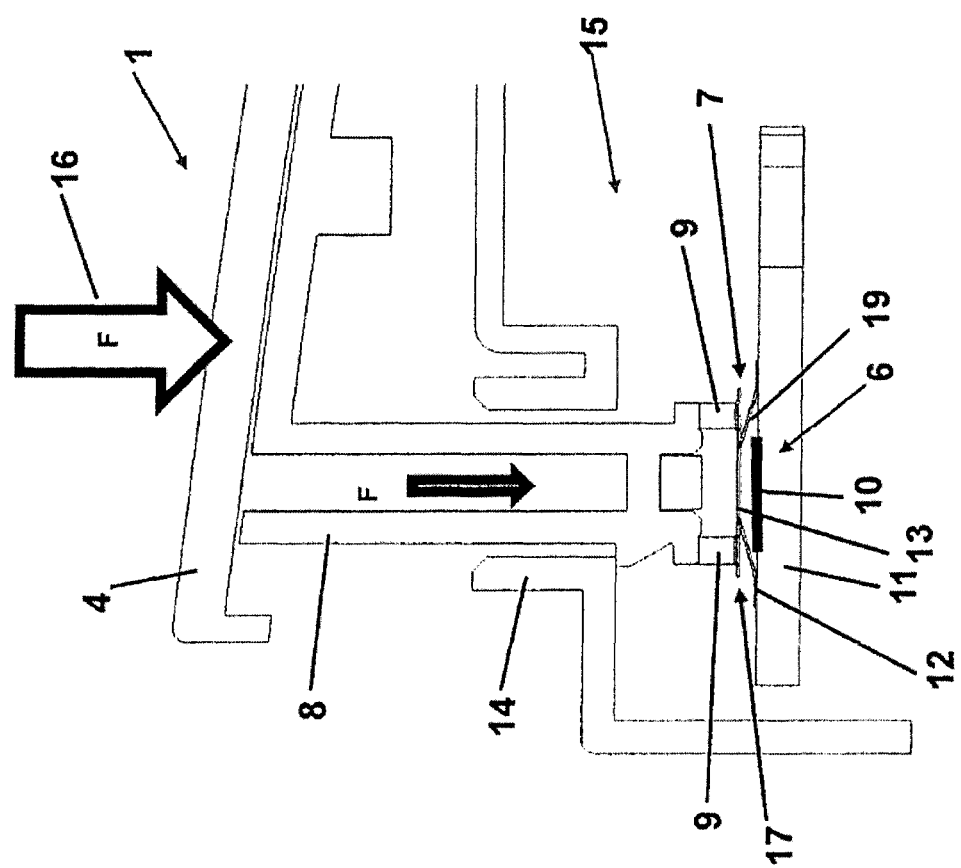
FIG. 2 shows a sectional view of the shift operating element incorporating a damping and/or restoring element, along the line 2-2 in FIG. 1.

As can further be seen in FIG. 2, a mechanical damping and/or restoring element 7 is arranged in the housing 14, which interacts with the actuation surface 4 upon the movement thereof associated with the application of the force 16. The function of the damping and/or restoring element 7, firstly, is the restoration of the actuation surface 4 to its original position, once the application of the force 16 is terminated. Secondly, the damping and/or restoring element 7 damps the movement of the actuation surface 4 associated with the application of the force 16, in order to provide a corresponding haptic sensation for the operator during the operation of the shift operating element 1. The damping and/or restoring element 7 is a constituent of the sensor 6, and the mechanical damping and/or restoring element 7 is integrated into the sensor 6. Naturally, conversely, the sensor 6 can also be integrated into the damping and/or restoring element 7. For the purposes of interaction with the actuation surface 4, an actuation element 8 for the transmission of the force 16 is arranged on the actuation surface 4, wherein the actuation element 8 acts on the damping and/or restoring element 7 by means of a stud 9. A plurality of studs 9 can be arranged on the actuation element 8 such that the damping and/or restoring element 7, upon the application of the force 16 to the actuation surface 4, moves in an approximately plane-parallel manner for the generation of a signal.

As already indicated, the mechanical damping and/or restoring element 7 is a constituent of the sensor 6. To this end, the damping and/or restoring element 7 comprises a first electrical sensor electrode 17 for the sensor 6. A further, second electrical sensor electrode 10 is provided for the sensor 6, such that the two sensor electrodes 17, 10 constitute a capacitive sensor. As can be seen from the side view in FIG. 3, the two sensor electrodes 17, 10, in the unloaded state, are arranged with a mutual clearance d. The variation Δd in the mutual clearance between the two sensor electrodes 17, 10, as a result of the movement of the damping and/or restoring element 7 associated with the application of the force 16, as a variation in force ΔF, alters the electrical capacitance of the sensor 6. This variation in the capacitance of the sensor 6 is evaluated, wherein the variation in capacitance ΔC is then be employed to generate a signal.

According to FIG. 2, a circuit board 11 is further provided in the housing 14, to and/or upon which the damping and/or restoring element 7 is fitted and/or arranged. The damping and/or restoring element 7 is electrically contacted with the circuit board 11 to constitute the first sensor electrode 17. The second sensor electrode 10 is constituted by printed conductors in the form of copper surfaces on the circuit board 11. As can be seen from FIG. 2, the first sensor electrode 17 on the damping and/or restoring element 7, by the application of force on the actuation surface 4, moves in an approximately plane-parallel manner to the second sensor electrode 10 on the circuit board 11. The damping and/or restoring element 7 and/or the circuit board 11 are arranged in the interior 15 of the housing, and protected against external influences.

Figure 3:
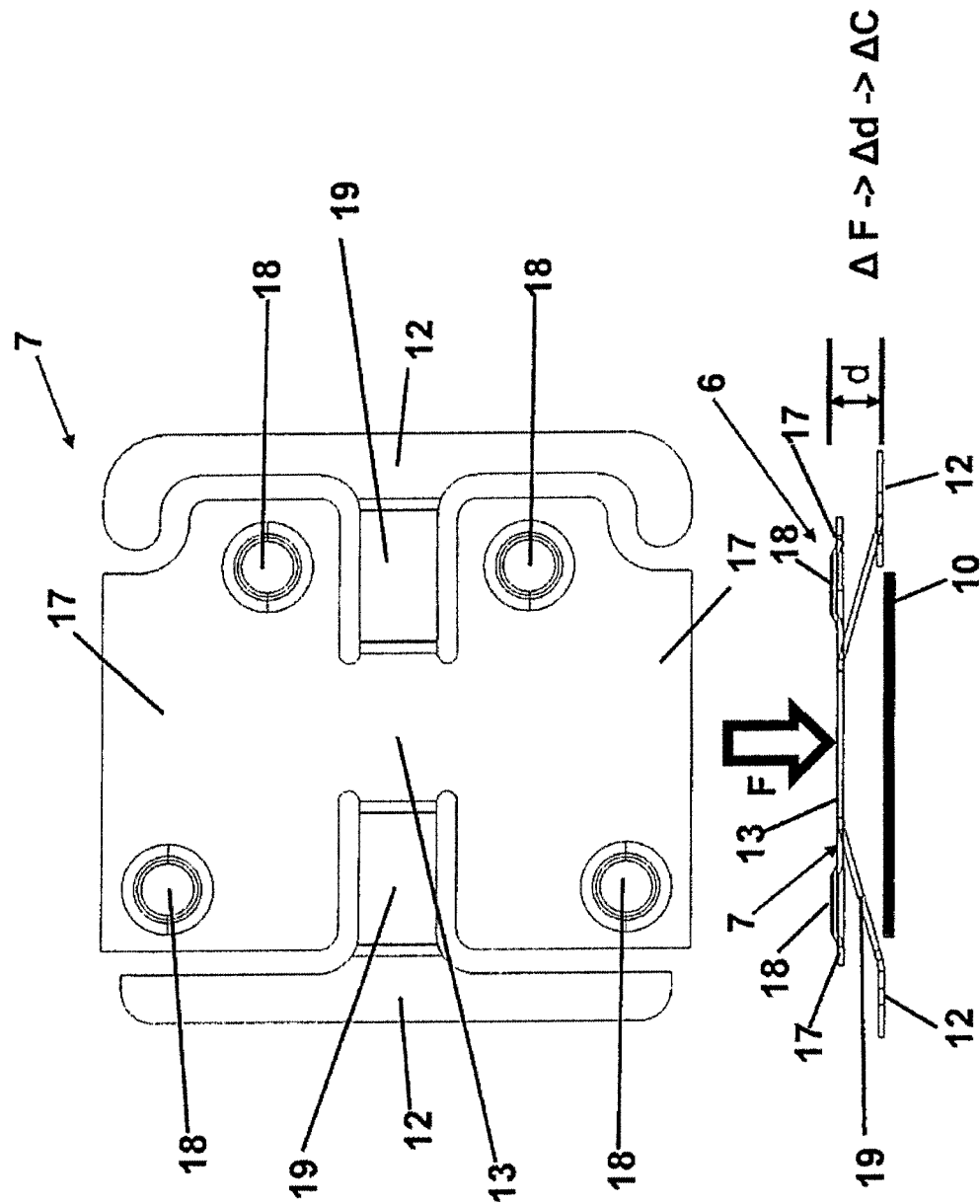
FIG. 3 shows an overhead and side view of the damping/ and or restoring element represented in FIG. 2.

As can further be seen from FIG. 3, the damping and/or restoring element 7 is configured as an elastic element 7 in the form of a spring element and, more specifically, in the form of a leaf spring. On the damping and/or restoring element 7, contact surfaces 12 for the electrical contacting of the circuit board 11 are arranged. According to the overhead view of the damping and/or restoring element 7, the contact surfaces 12 are configured with an approximate H-shape, wherein the connecting surface 13 of the contact surfaces 12 comprises elastic spring arms 19. On the connecting surface 13 of the contact surfaces 12, which is configured with a bulging profile, two approximately centrally arranged, mutually opposing and approximately rectangular surfaces 17 are arranged for interaction with the actuation element 8. The surfaces 17, where applicable in combination with the connecting surface 13, constitute the first sensor electrode 17.

The actuation element 8, by means of two respective studs 9, engages with two corresponding nubs 18 on the respective surface 17. As the damping and/or restoring element 7 comprises two such surfaces 17, a total of four studs 9, arranged approximately at the corners of the rectangular surface 17, thus interact with the damping and/or restoring element 7 upon the movement of the actuation surface 4, such that the substantially plane-parallel movement of the actuation surface 4 and of the damping and/or restoring element 7 is ensured. The damping and/or restoring element 7 is comprised of a metal and is manufactured in the form of a stamped and bent part.

In the present case, a capacitively-operating sensor 6 is described as the shift operating element 1. Naturally, the sensor can also be based upon another sensor principle, for example, the damping and/or restoring element can be a constituent of an inductive sensor, a magnetic sensor, a Hall type sensor or similar, no further representation of which is provided, however. Moreover, the present invention is not limited to the exemplary embodiment described and represented, but rather comprises all further developments, by persons skilled in the art, in the context of the present invention defined in the patent claims. Accordingly, the shift operating element according to the present invention can not only be employed in motor vehicles, i.e. as an operating switch or in the form of a shift operating field comprising a plurality of operating switches in an automotive application, but also as a shift operating element in consumer goods, for example, in household appliances, washing machines, coffee machines, audio devices, video devices, telecommunication devices, power tools or similar.

LIST OF REFERENCE NUMBERS

1: Shift operating element
2: Functional symbol
3: Functional indicator
4: Actuation surface
5: Element
6: Sensor
7: Damping and/or restoring element/elastic element
8: Actuation element
9: Stud (on actuation element)
10: (Second) sensor electrode
11: Circuit board
12: Contact surface (on damping and/or restoring element)
13: Connecting surface (of contact surfaces)
14: Housing
15: Interior (of housing)
16: Force
17: Surface (on damping and/or restoring element)/(first) sensor electrode
18: Nub
19: Spring arm

The invention claimed is:

1. A shift operating element having an actuation surface which can be moved by manual application of force by a finger of a human hand, and having a sensor which interacts with the actuation surface such that the sensor, upon the movement of the actuation surface by the finger of the human hand, generates a signal, wherein the signal is employed to shift and/or trigger a function, in a manner of a shift signal, wherein a damping and/or restoring element is provided, which interacts with an actuation element arranged on the actuation surface upon the movement thereof, wherein the damping and/or restoring element is a constituent of the sensor and the damping and/or restoring element has a connecting surface comprising elastic spring arms, wherein, on the spring arms, two approximately centrally arranged, mutually opposing and approximately rectangular surfaces are arranged for interaction with the actuation element wherein the rectangular surfaces constitute a first sensor electrode, and wherein a nub is configured on the rectangular surfaces, for interaction with a stud on the actuation element.

2. The shift operating element as claimed in claim 1, wherein the actuation element acts on the damping and/or restoring element, wherein the damping and/or restoring element, upon the application of force to the actuation surface, moves in an approximately plane-parallel manner, and wherein upon the movement of the actuation surface, the actuation element can interact with the damping and/or restoring element in order to generate a signal.

3. The shift operating element as claimed in claim 1, wherein the damping and/or restoring element functions as the first sensor electrode for the sensor, wherein a further second sensor electrode is provided for the sensor, such that the two sensor electrodes constitute a capacitive sensor, and wherein the variation in the mutual clearance between the two sensor electrodes, associated with the movement of the damping and/or restoring element, alters the capacitance of the sensor, wherein the variation in the capacitance of the sensor is then employed to generate the signal.

4. The shift operating element as claimed in claim 3, further comprising a circuit board, wherein the damping and/or restoring element is fitted to and/or arranged on the circuit board, wherein the damping and/or restoring element is electrically contacted with the circuit board to constitute the first sensor electrode, wherein the second sensor electrode is constituted by printed conductors in the form of copper surfaces, on the circuit board, and wherein the first sensor electrode on the damping and/or restoring element, by the application of force on the actuation surface, moves in an approximately plane-parallel manner to the second sensor electrode on the circuit board.

5. The shift operating element as claimed in claim 1, wherein the damping and/or restoring element is a mechanical damping and/or restoring element.

6. The shift operating element as claimed in claim 1, wherein the damping and/or restoring element is configured as an elastic element in the form of a leaf-spring spring element, wherein the elastic element incorporates in the connecting surface contact surfaces of an approximately H-shaped design, for the purposes of electrical contacting with a circuit board.

7. The shift operating element as claimed in claim 1, wherein the damping and/or restoring element is comprised of a metal, and wherein the damping and/or restoring element is manufactured in the form of a stamped and bent part.

8. The shift operating element as claimed in claim 1, further comprising a housing, wherein the actuation surface constitutes a substantially closed surface of the housing, and wherein the damping and/or restoring element and/or a circuit board are arranged in the interior of the housing.

9. The shift operating element as claimed in claim 1, wherein the damping and/or restoring element is a constituent of an inductive sensor, a magnetic sensor, or a Hall type sensor.

10. A shift operating element according to claim 1 for a motor vehicle.

11. The shift operating element as claimed in claim 1, wherein a mechanical damping and/or restoring element is integrated into the sensor and/or the sensor is integrated into the damping and/or restoring element.

* * * * *